United States Patent
Ruffler

(10) Patent No.: US 8,536,062 B2
(45) Date of Patent: Sep. 17, 2013

(54) CHEMICAL REMOVAL OF OXIDE LAYER FROM CHIP PADS

(75) Inventor: Jens Ruffler, Beaverton, OR (US)

(73) Assignee: Advanced Inquiry Systems, Inc., Tigard, OR (US)

( * ) Notice: Subject to any disclaimer, the term of this patent is extended or adjusted under 35 U.S.C. 154(b) by 876 days.

(21) Appl. No.: 12/284,618

(22) Filed: Sep. 22, 2008

(65) Prior Publication Data

US 2009/0081875 A1 Mar. 26, 2009

Related U.S. Application Data

(60) Provisional application No. 60/994,946, filed on Sep. 21, 2007.

(51) Int. Cl.
*H01L 21/302* (2006.01)

(52) U.S. Cl.
USPC ........... 438/722; 438/704; 438/706; 438/720; 216/73; 216/77

(58) Field of Classification Search
USPC .............. 438/12, 612, 613, 617, 706, 734, 438/737, 754, 714, 722, 742; 216/67, 73, 216/77
See application file for complete search history.

(56) References Cited

U.S. PATENT DOCUMENTS

| | | |
|---|---|---|
| 4,249,034 A | 2/1981 | Fichot et al. |
| 4,975,638 A | 12/1990 | Evans et al. |
| 5,070,297 A | 12/1991 | Kwon et al. |
| 5,221,422 A | 6/1993 | Das et al. |
| 5,937,515 A | 8/1999 | Johnson |
| 6,181,145 B1 | 1/2001 | Tomita et al. |
| 6,383,909 B1 * | 5/2002 | Nagaya et al. ............... 438/617 |
| 6,737,879 B2 | 5/2004 | Johnson |
| 6,836,130 B2 | 12/2004 | Johnson |
| 6,991,969 B2 | 1/2006 | Johnson |
| 7,020,957 B2 | 4/2006 | Johnson |
| 7,282,931 B2 | 10/2007 | Johnson |
| 7,453,277 B2 | 11/2008 | Johnson |
| 7,456,643 B2 | 11/2008 | Johnson |
| 7,459,924 B2 | 12/2008 | Johnson |
| 7,489,148 B2 | 2/2009 | Johnson |
| 7,498,800 B1 | 3/2009 | Whiteman |
| 7,532,021 B2 | 5/2009 | Johnson |
| 7,532,022 B2 | 5/2009 | Johnson |
| 7,579,852 B2 | 8/2009 | Johnson |
| 7,723,980 B2 | 5/2010 | Johnson et al. |
| 7,791,174 B2 | 9/2010 | Johnson |
| 2002/0028586 A1 * | 3/2002 | Haley et al. ............... 438/784 |
| 2003/0094962 A1 | 5/2003 | Rincon et al. |
| 2008/0003819 A1 | 1/2008 | Johnson et al. |
| 2009/0224410 A1 | 9/2009 | Johnson |
| 2010/0066395 A1 | 3/2010 | Johnson |
| 2010/0144069 A1 | 6/2010 | Johnson |
| 2010/0151670 A1 | 6/2010 | Johnson |

* cited by examiner

*Primary Examiner* — Lan Vinh
(74) *Attorney, Agent, or Firm* — Perkins Coie LLP

(57) ABSTRACT

Methods are provided for removing an oxide layer from a metal pad on an integrated circuit in order to reduce contact resistance. In one embodiment, aluminum oxide, on the surface of a bond pad substantially comprised of aluminum, is reacted with a first chemical agent to form an inorganic salt, and the inorganic salt is then reacted with a second chemical agent leaving a substantially bare, that is, unoxidized, aluminum surface.

10 Claims, 9 Drawing Sheets

CHEMICAL REMOVAL OF OXIDE LAYER FROM CHIP PADS

CROSS-REFERENCE TO RELATED APPLICATIONS

This nonprovisional application claims the benefit of provisional application 60/994,946, filed 21 Sep. 2007, and entitled "Chemical Removal Of Oxide Layer From Chip Pads", the entirety of which is incorporated herein by reference.

FIELD OF THE INVENTION

The present invention relates generally to reducing contact resistance for electrical connections made to bonding pads, or similar structures, on integrated circuits.

BACKGROUND

Advances in semiconductor manufacturing technology have resulted in, among other things, reducing the cost of sophisticated electronic products to the extent that the integrated circuits fabricated in accordance with these semiconductor manufacturing technologies have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, planarizing and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. Such conductive regions are commonly referred to as pads. Pads are commonly used to provide electrical access to the integrated circuit both during testing and during the operation of the integrated circuit as it is incorporated into a final product. Typical pads are formed from aluminum. It is well-known that the surfaces of aluminum which are exposed to the atmosphere will oxidize. These oxidation layers interfere with the formation of low resistance electrical connection to the pads.

During the process of testing the performance of the integrated circuits, the pads are commonly contacted with probe needles, or other contact structures, of a probe card. It is through such temporary connections that a test apparatus may electrically interact with an integrated circuit.

Conventionally, the probe needles, or other contact structures, of the probe card are brought into physical contact with the pads and then moved laterally to "scrub" the pad. The scrubbing operation is intended to break through the oxide layer on the top surface of the pad, thereby providing reduced contact resistance. Unfortunately, scrubbing disturbs the pad structure and can contribute to yield loss due to failure of bond wires to properly attach to the disturbed pad structure.

What is needed are methods and apparatus for providing low contact resistance connections to pads of integrated circuits without disturbing or substantially redistributing the material from which the pads are formed.

SUMMARY OF THE INVENTION

Briefly, methods are provided for removing an oxide layer from a metal pad on an integrated circuit in order to reduce contact resistance.

In a further aspect of the present invention, aluminum oxide, on the surface of a bond pad substantially comprised of aluminum, is reacted with a first chemical agent to form an inorganic salt, and the inorganic salt is then reacted with a second chemical agent leaving a substantially bare, that is, unoxidized, aluminum surface.

It will be appreciated that the cross-sectional representations of FIGS. 1-7 are illustrative of the present invention and are not necessarily drawn to scale.

Figure 8:
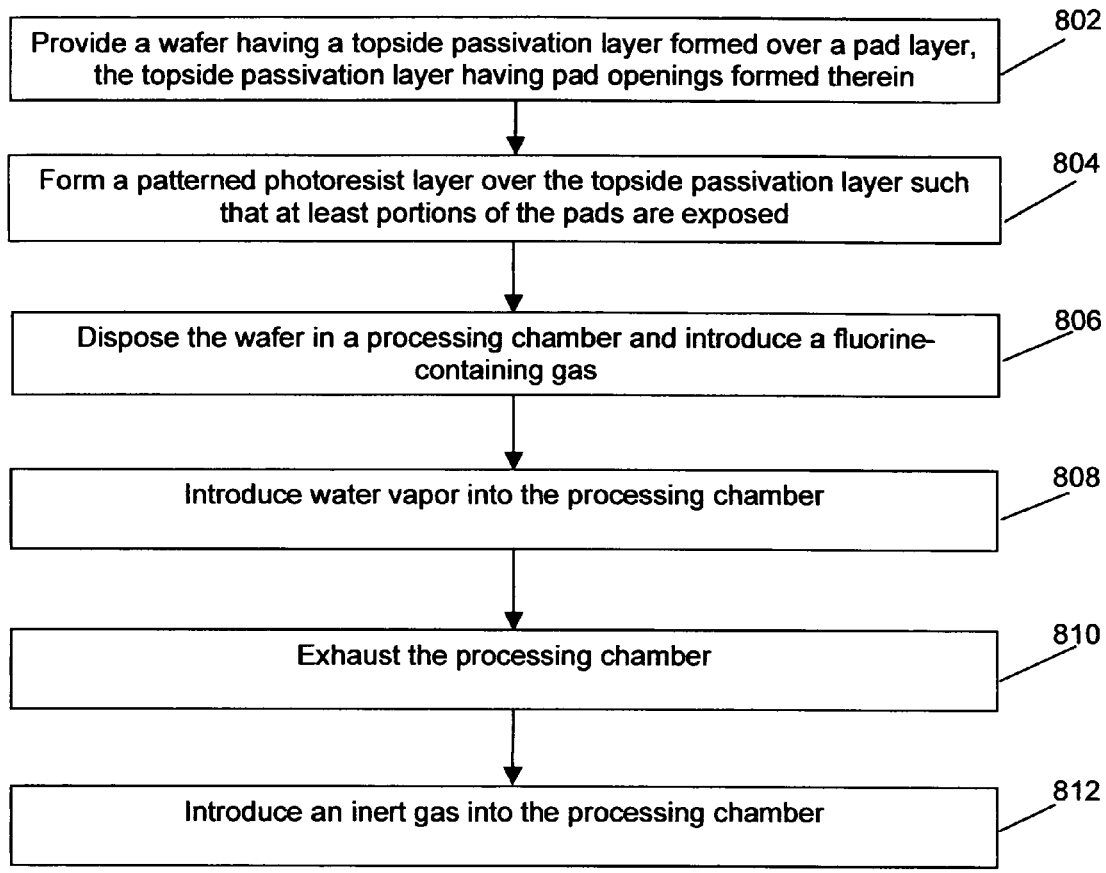

FIG. 8 is a flow diagram of a process for providing an improved bond pad electrical contact surface in accordance with the present invention.

Figure 9:
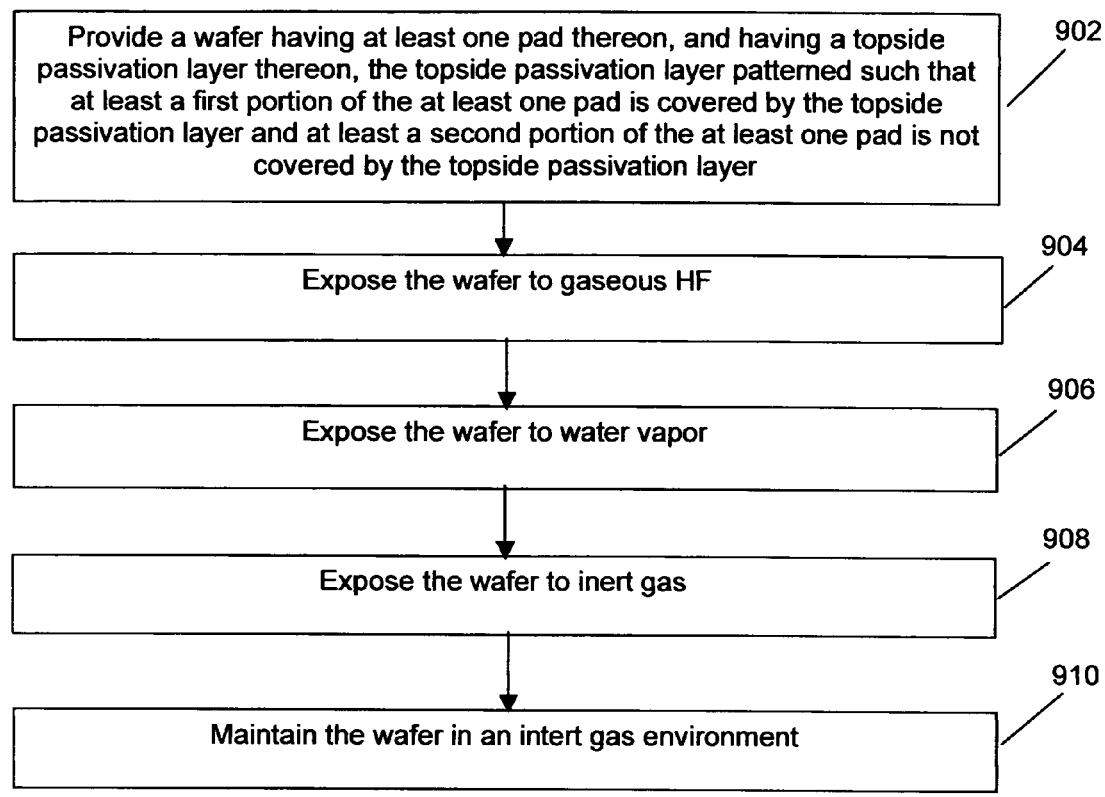

FIG. 9 is a flow diagram of a process for providing an improved bond pad electrical contact surface in accordance with the present invention.

Figure 10:
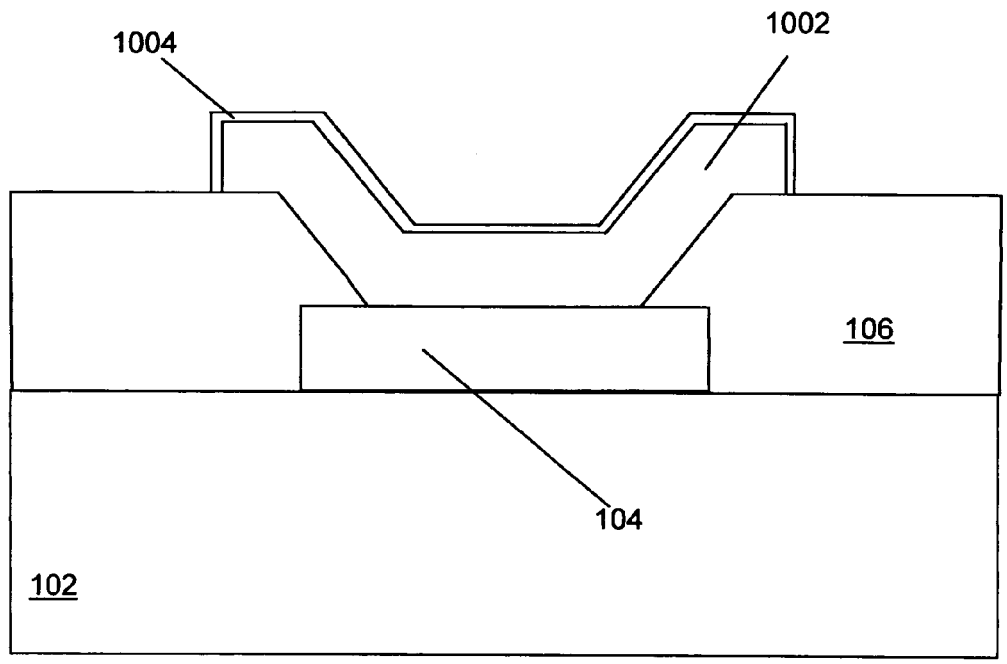

FIG. 10 is a cross-sectional representation of a wafer with a pad structure and a topside passivation layer having a pad opening therein which is aligned with the pad structure; an aluminum bond pad disposed superjacent the pad structure and extending laterally outward from the pad structure and onto the topside passivation layer; and an oxidation layer disposed over the exposed surface of the aluminum bond pad.

Figure 11:
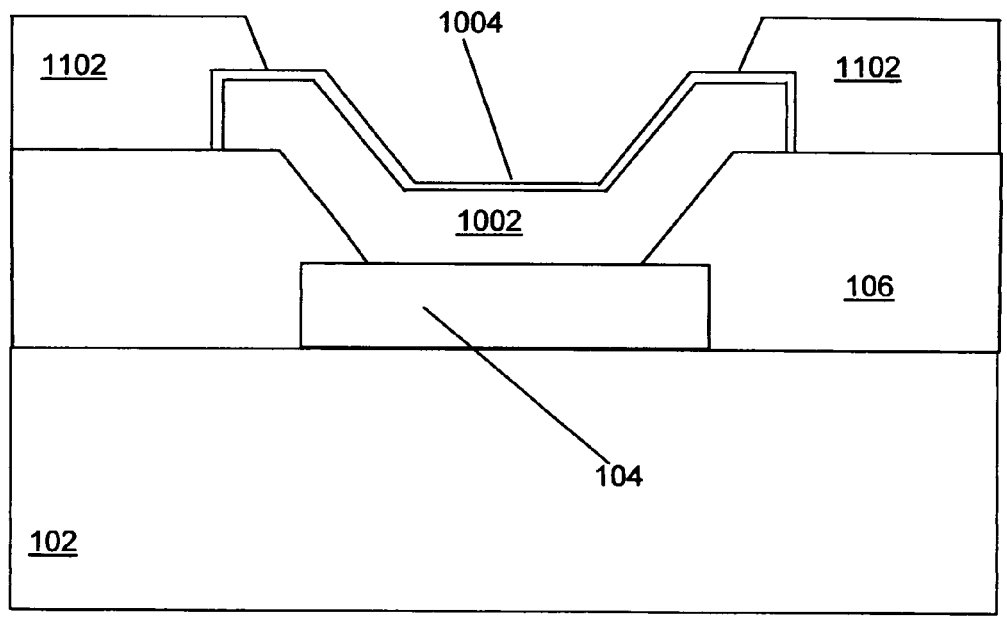

FIG. 11 is a cross-sectional representation of the wafer of FIG. 10 subsequent to the formation of a patterned resist layer that covers the topside passivation layer, and overlaps a portion of the oxidation layer of the bond pad.

DETAILED DESCRIPTION

Generally, methods are disclosed for improving electrical contact with the bond pads of an integrated circuit by chemically removing an oxidation layer from the top surface of those bond pads prior to making electrical contact therewith.

In the following description numerous specific details are set forth. One of ordinary skill in the art, however, will appreciate that these specific details are not necessary to practice all embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well-known semiconductor fabrication processes, techniques, materials, equipment, and so on, (e.g., the well-known semiconductor manufacturing steps of applying, patterning, and removing photoresist) have not been set forth in particular detail in order to not obscure the present invention.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

TERMINOLOGY

As used herein, "pad" refers to a metallized region of the surface of an integrated circuit, which is used to form a physical connection terminal for communicating signals to and/or from the integrated circuit.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments, a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

Figure 1:
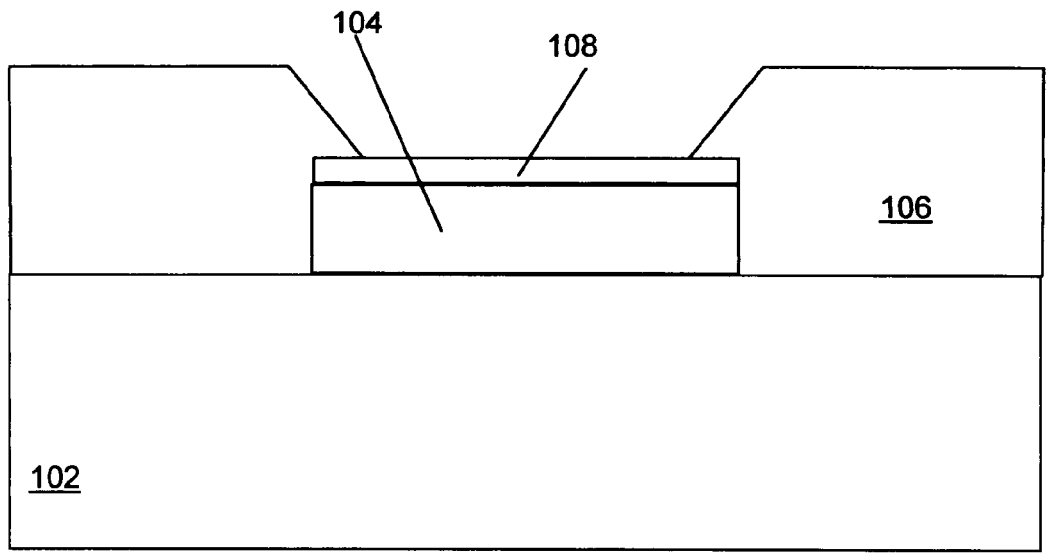
FIG. 1 is a cross-sectional representation of a wafer with an aluminum bond pad and a topside passivation layer in accordance with the prior art, where the bond pad has a surface coating formed by oxidation due to exposure with the atmosphere.

Referring to FIG. 1, a cross-sectional representation of a wafer 102 with an aluminum bond pad 104 and a topside passivation layer 106 in accordance with the prior art is shown, where bond pad 104 has a surface coating 108 formed by oxidation, typically due to exposure to the atmosphere. One problem with this prior art arrangement is that probe needles, or other contact structures, commonly used to make electrical contact with the bond pads for testing purposes, scrub, or otherwise disturb, the surface structure of bond pad 104. It is conventionally believed that scrubbing bond pad 104 is necessary to break through oxidation layer 108 on the bond pad in order to make a satisfactory electrical connection therewith. Such structural disturbance or redistribution of bond pad metal can adversely affect subsequent attempts to attach a bond wire to the bond pad.

Figure 2:
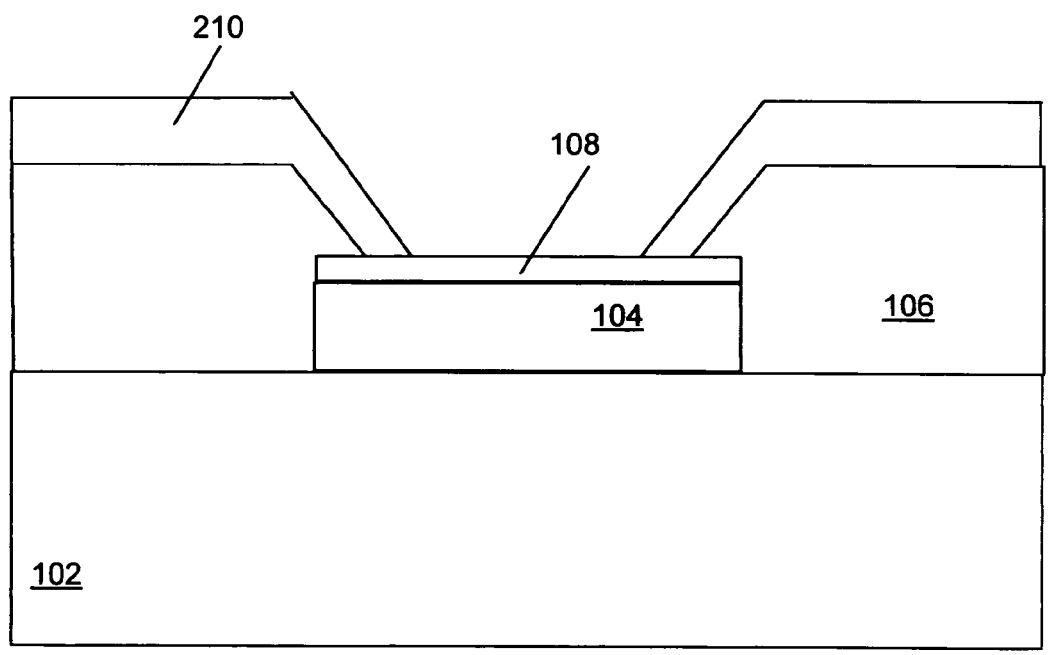
FIG. 2 is a cross-sectional representation of the wafer of FIG. 1 subsequent to the formation of a patterned resist layer that covers the topside passivation layer, and overlaps a portion of the oxidation layer of the bond pad.

FIG. 2 is a cross-sectional representation of the wafer of FIG. 1 subsequent to the formation of a patterned photoresist layer 210 that covers topside passivation layer 106, and overlaps a portion of oxidation layer 108 on bond pad 104.

Figure 3:
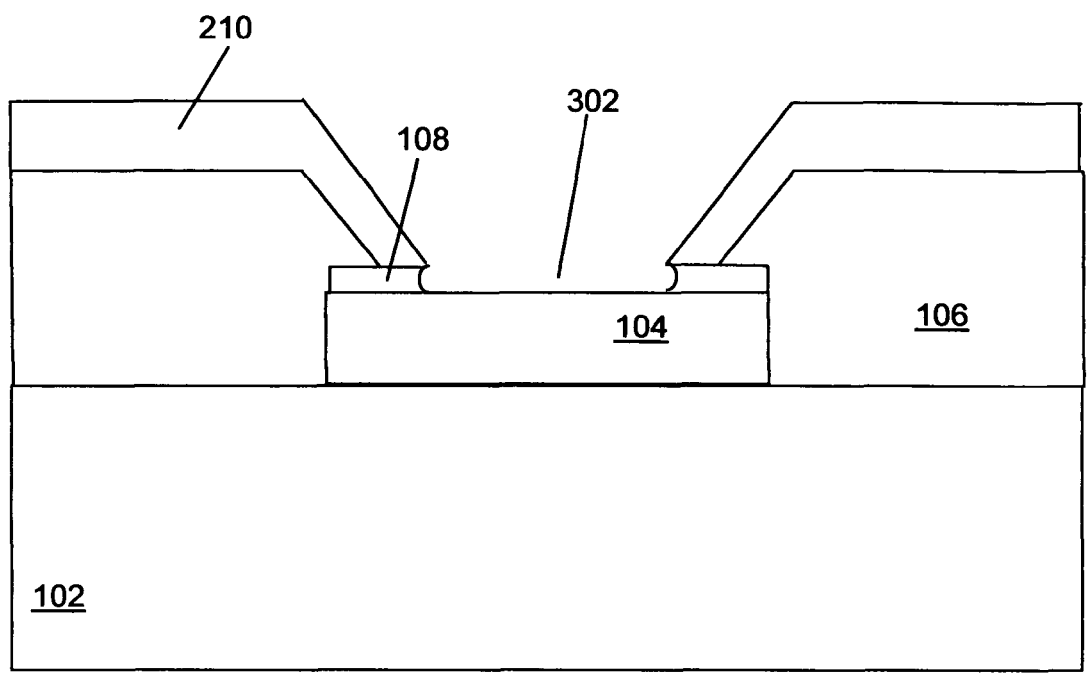
FIG. 3 is a cross-sectional representation of the structure of FIG. 2 after removal of the exposed portion of the oxidation layer.

FIG. 3 shows the structure of FIG. 2 after the exposed portion of oxidation layer 108 has been removed, leaving an opening 302 that exposes the substantially bare surface of bond pad 104.

Figure 4:
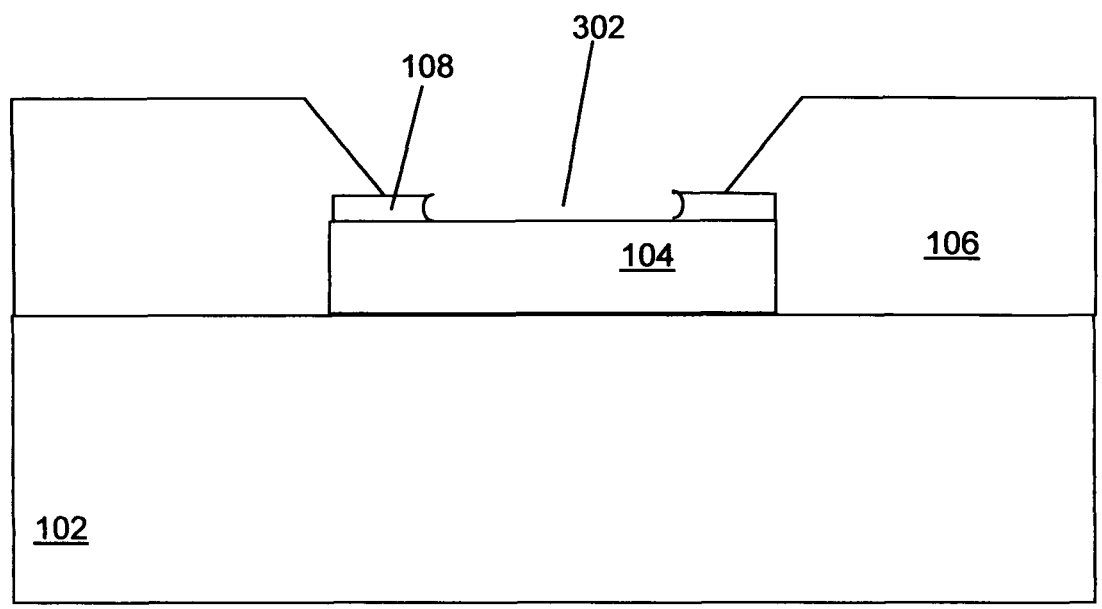
FIG. 4 is a cross-sectional representation of the structure of FIG. 3 after removal of the photoresist layer.

FIG. 4 shows the structure of FIG. 3, after photoresist layer 210 has been removed.

Figure 5:
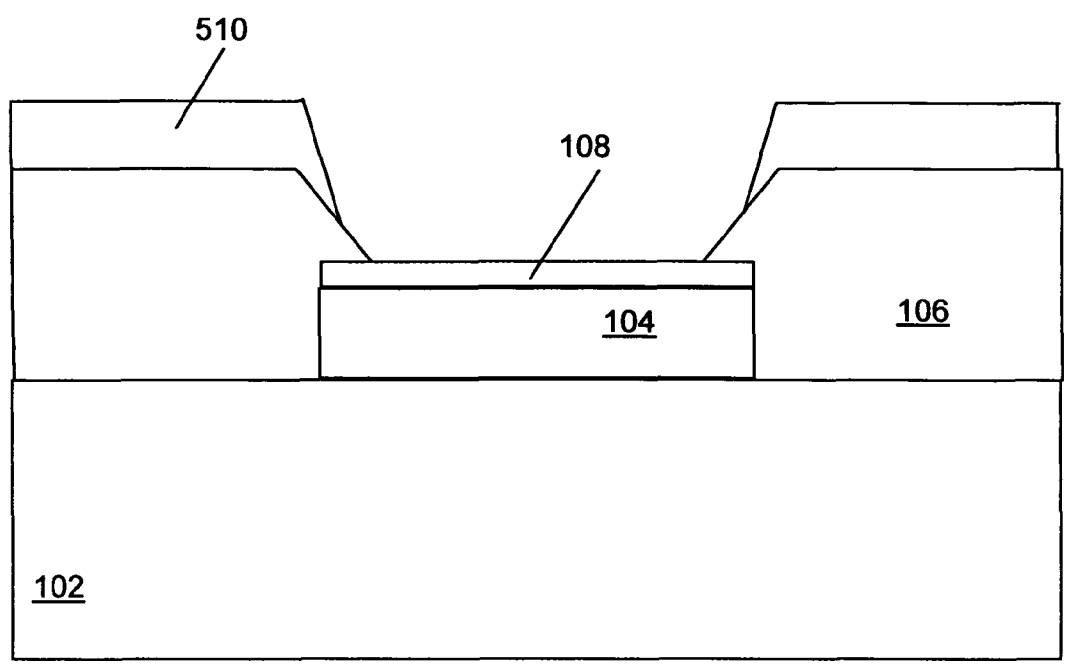
FIG. 5 is a cross-sectional representation of the wafer of FIG. 1 subsequent to the formation of a patterned photoresist layer that covers most of the topside passivation layer, and which does not overlap any portion of the oxidation layer on the bond pad.

Referring to FIG. 5, an alternative embodiment is shown and described. More particularly, FIG. 5 is a cross-sectional representation of the wafer of FIG. 1 subsequent to the formation of a patterned photoresist layer 510 that covers most of topside passivation layer 106, and does not overlap any portion of oxidation layer 108.

Figure 6:
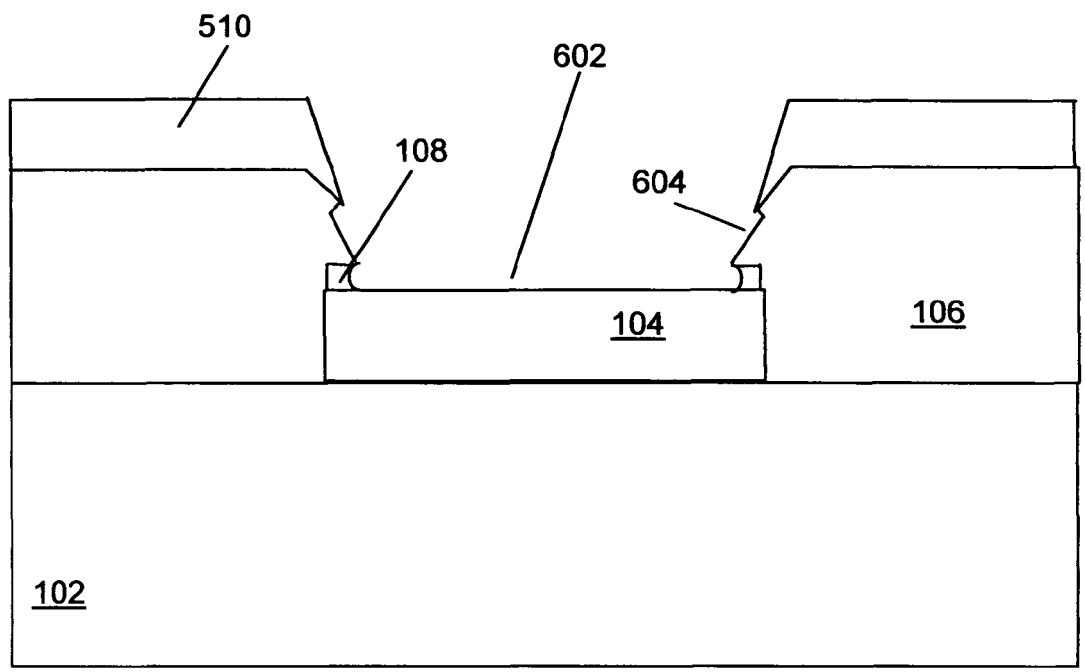
FIG. 6 is a cross-sectional representation of the structure of FIG. 5 after removal of the exposed portion of the oxidation layer, and removal of a portion of the exposed topside passivation layer.

FIG. 6 shows the structure of FIG. 5 after the exposed portion of oxidation layer 108 has been removed, leaving an opening 602 that exposes the substantially unoxidized surface of bond pad 104. It is noted that there is also some removal of the exposed portion of topside passivation layer 106 as shown at 604. In this illustrative embodiment, topside layer 106 is formed of silicon nitride and oxidation layer 108 is formed of aluminum oxide; and the chemical agents used to eliminate oxidation layer 108 also remove some of passivation layer 106. In this illustrative embodiment, the amount of silicon nitride removed is insignificant with respect to the protective function of topside passivation layer 106.

Figure 7:
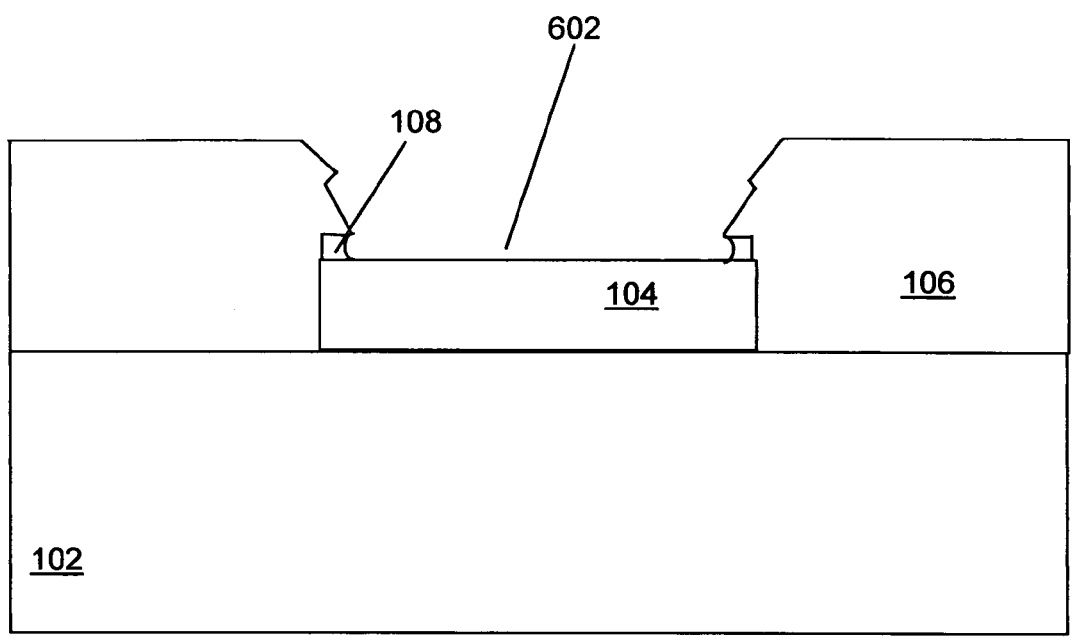
FIG. 7 is a cross-sectional representation of the structure of FIG. 6 after the photoresist layer has been removed.

FIG. 7 shows the structure of FIG. 6 after photoresist layer 510 has been removed.

FIG. 8 illustrates one exemplary embodiment of the present invention, in which integrated circuits are fabricated on wafers up through and including the steps of forming the topside passivation layer and patterning the topside passivation to form pad openings 802. In this embodiment the pads are formed of aluminum. It is noted that the present invention has utility for aluminum pads that include elements other than aluminum. Subsequent to formation of the pad openings, a layer of photoresist is deposited and patterned such that the topside passivation layer is covered by the patterned photoresist and portions of the pads not covered by the topside passivation layer are exposed 804. This photoresist layer is typically several microns thick. With the wafer disposed in an environmentally appropriate processing chamber, hydrogen fluoride gas is introduced 806 to react with the aluminum oxide layer on the exposed surface of the pads. This results in a reacting residue of solid phase aluminum fluoride ($AlF_3$) on the pads. It is noted that the etch rate can be reduced by diluting with nitric acid ($HNO_3$) and an alcohol-containing gas. Water vapor is then introduced 808 into the processing chamber and the reacting residue of solid phase aluminum fluoride ($AlF_3$) on the pads is decomposed and exhausted 810. It is noted that other solvents, such as for example xylene or nitric acid, may used. An inert gas, such as for example, argon, is introduced 812 into the processing chamber to drive out the gaseous $Al_2O_3$. The inert gas prevents the reformation of an oxide layer on the pads. It is noted that other fluorine-containing gases can be substituted for, or mixed with, the hydrogen fluoride gas. It is further noted that these fluorine-containing gases may be introduced into the processing chamber with an inert carrier gas.

After this process of oxide layer removal, the wafers are stored in containers having an oxygen-free atmosphere for transport to the test floor. In other words, the wafers are stored in a vacuum, or in an inert atmosphere, so as to prevent the re-oxidation of the aluminum pad metal. Another requirement is the ability to handle these wafers in an oxygen-free or non-oxidizing environment on the test floor, so as to eliminate the possibility of oxide growth.

FIG. 9 illustrates another embodiment of the present invention which includes providing 902 a wafer having at least one pad thereon, and further having a topside passivation layer thereon, the topside passivation layer patterned such that at least a first portion of the at least one pad is covered by the topside passivation layer and at least a second portion of the at least one pad is not covered by the topside passivation layer; exposing 904 the wafer to gaseous HF; exposing 906 the wafer to water vapor; exposing 908 the wafer to an inert gas; and maintaining 910 the wafer in an inert gas environment. In a further aspect of the present invention, the wafer is then aligned with and removably attached to a wafer translator while the inert atmosphere is maintained to prevent re-oxidation of the pads.

The foregoing illustrative embodiments of the present invention are described in the context of integrated circuits having a bond pad layer and an overlying topside passivation layer having pad openings therein. It is noted that alternative bond pad arrangements are comprehended by the present invention. FIGS. 10-11 illustrate an alternative bond pad arrangement for which the present invention may be used in reducing or eliminating an oxide layer on an aluminum pad.

FIG. 10 is a cross-sectional representation of a wafer 102 with a pad structure 104 and a topside passivation layer 106 having a pad opening therein which is aligned with pad structure 104; an aluminum bond pad 1002 disposed superjacent pad structure 104 and extending laterally outward from pad structure 104 and onto topside passivation layer 106; and an oxidation layer 1004 disposed over the exposed surface of aluminum bond pad 1002.

FIG. 11 is a cross-sectional representation of the wafer of FIG. 10 subsequent to the formation of a patterned photoresist, or masking, layer 1102 that covers topside passivation layer 106, and overlaps a portion of oxidation layer 1004 of bond pad 1002.

Still referring to FIGS. 10-11, it can be seen that although peripheral portions of aluminum bond pad 1002 extend up and onto the upper surfaces of topside passivation layer 106, the oxide layer 1004, or relevant portions thereof, can still be removed by disposing the wafer in an environmentally appropriate processing chamber, introducing hydrogen fluoride gas to react with the aluminum oxide layer on the exposed surface of the pads; introducing water vapor into the processing chamber to decompose the solid phase aluminum fluoride ($AlF_3$) on the pads and exhaust it; and introducing an inert gas into the processing chamber to drive out the gaseous $Al_2O_3$. As previously described, the inert gas prevents the reformation of an oxide layer on the pads. In the case of the embodiment of FIG. 10, which does not include a masking layer for protection of topside passivation layer 106, the composition of topside passivation layer 106 should be chosen so that the chemical process of pad oxide removal does not adversely affect topside passivation layer 106. In the case of the embodiment of FIG. 11, it will be appreciated that masking layer 1102 may be removed as long as this removal process does not re-oxidize pad 1002.

CONCLUSION

The exemplary apparatus illustrated and described herein find application in at least the field of integrated circuit test and analysis.

What is claimed is:

1. A method of preparing wafers for testing, comprising:
providing a wafer having a topside passivation layer formed over an aluminum pad layer, the topside passivation layer having pad openings formed therein;
forming a patterned photoresist layer over the topside passivation layer such that at least portions of the pads are exposed; and
removing a layer of aluminum oxide from the exposed portion of the pads by:
disposing the wafer in a processing chamber and introducing a fluorine-containing gas,
introducing a solvent into the processing chamber, and exhausting the processing chamber.

2. The method of claim 1, wherein the aluminum pad layer is disposed over an aluminum bond pad.

3. The method of claim 1, wherein the fluorine-containing gas is hydrogen fluoride.

4. The method of claim 3, wherein the solvent comprises a materials selected from the group consisting of water vapor, xylene, and nitric acid.

5. The method of claim 4, further comprising:
introducing, subsequent to introducing the solvent, an inert gas into the processing chamber.

6. The method of claim 5, further comprising:
storing the wafer in an oxygen-free environment.

7. The method of claim 6, wherein the oxygen-free environment is a vacuum or an inert atmosphere.

8. A method of preparing wafers for testing, comprising:
providing a wafer having at least one aluminum pad thereon, and having a topside passivation layer thereon, the topside passivation layer patterned such that at least a first portion of the at least one pad is covered by the topside passivation layer and at least a second portion of the at least one pad is not covered by the topside passivation layer; and removing a layer of aluminum oxide from the second portion of the at least one pad by:
  exposing the wafer to gaseous HF;
  exposing the wafer to a solvent;
  exposing the wafer to an inert gas; and
  maintaining the wafer in an inert gas environment.

9. The method of claim 8, wherein the solvent is water vapor.

10. The method of claim 8, wherein the aluminum pad layer is disposed over an aluminum bond pad.

* * * * *